(12) United States Patent
Uusitalo et al.

(10) Patent No.: US 7,472,787 B2
(45) Date of Patent: Jan. 6, 2009

(54) FEEDING DEVICE FOR SMALL PARTS

(75) Inventors: Jani Uusitalo, Tampere (FI); Henri Viinikainen, Tampere (FI)

(73) Assignee: Wisematic Oy, Tampere (FI)

( * ) Notice: Subject to any disclaimer, the term of this patent is extended or adjusted under 35 U.S.C. 154(b) by 439 days.

(21) Appl. No.: 10/555,695

(22) PCT Filed: May 5, 2004

(86) PCT No.: PCT/FI2004/050056

§ 371 (c)(1),
(2), (4) Date: Nov. 4, 2005

(87) PCT Pub. No.: WO2004/099045

PCT Pub. Date: Nov. 18, 2004

(65) Prior Publication Data

US 2006/0278498 A1    Dec. 14, 2006

(30) Foreign Application Priority Data

May 5, 2003    (FI) .................................. 20030668

(51) Int. Cl.
*B65G 27/02*    (2006.01)
(52) U.S. Cl. ................... 198/752.1; 198/395; 198/525; 414/749.1

(58) Field of Classification Search ................. 198/391, 198/395, 752.1, 525; 193/32; 414/749.1, 414/751.1; 406/75, 83
See application file for complete search history.

(56) References Cited

U.S. PATENT DOCUMENTS

| 4,372,463 | A | * | 2/1983 | Notarione et al. ............. 221/10 |
| 4,608,464 | A | * | 8/1986 | Morikawa et al. ....... 379/406.06 |
| 5,314,055 | A | * | 5/1994 | Gordon ...................... 198/395 |
| 5,687,831 | A | | 11/1997 | Carlisle |
| 5,703,784 | A | | 12/1997 | Pearson |
| 5,853,078 | A | * | 12/1998 | Kneubuhler ................. 198/391 |
| 6,102,193 | A | * | 8/2000 | Rivers, Jr. .............. 198/750.13 |
| 6,443,291 | B2 | * | 9/2002 | Rivers, Jr. .................... 198/392 |
| 6,789,661 | B2 | * | 9/2004 | Davies et al. ............... 198/391 |

FOREIGN PATENT DOCUMENTS

JP    2000126942 A    5/2000

* cited by examiner

*Primary Examiner*—Mark A Deuble
(74) *Attorney, Agent, or Firm*—Venable LLP; Eric J. Franklin

(57) ABSTRACT

A feeding device for feeding small parts to be identified and picked up and a part handling apparatus and sorting apparatus including the feeding device. The feeding device includes a picking platform, a dispenser arranged to dispense the parts to the picking platform, and a return member. The feeding device also includes a decelerator connected to the dispenser to reduce the speed of the part to be fed to the dispenser.

18 Claims, 4 Drawing Sheets

FEEDING DEVICE FOR SMALL PARTS

CROSS-REFERENCE TO RELATED APPLICATIONS

Figure 1:
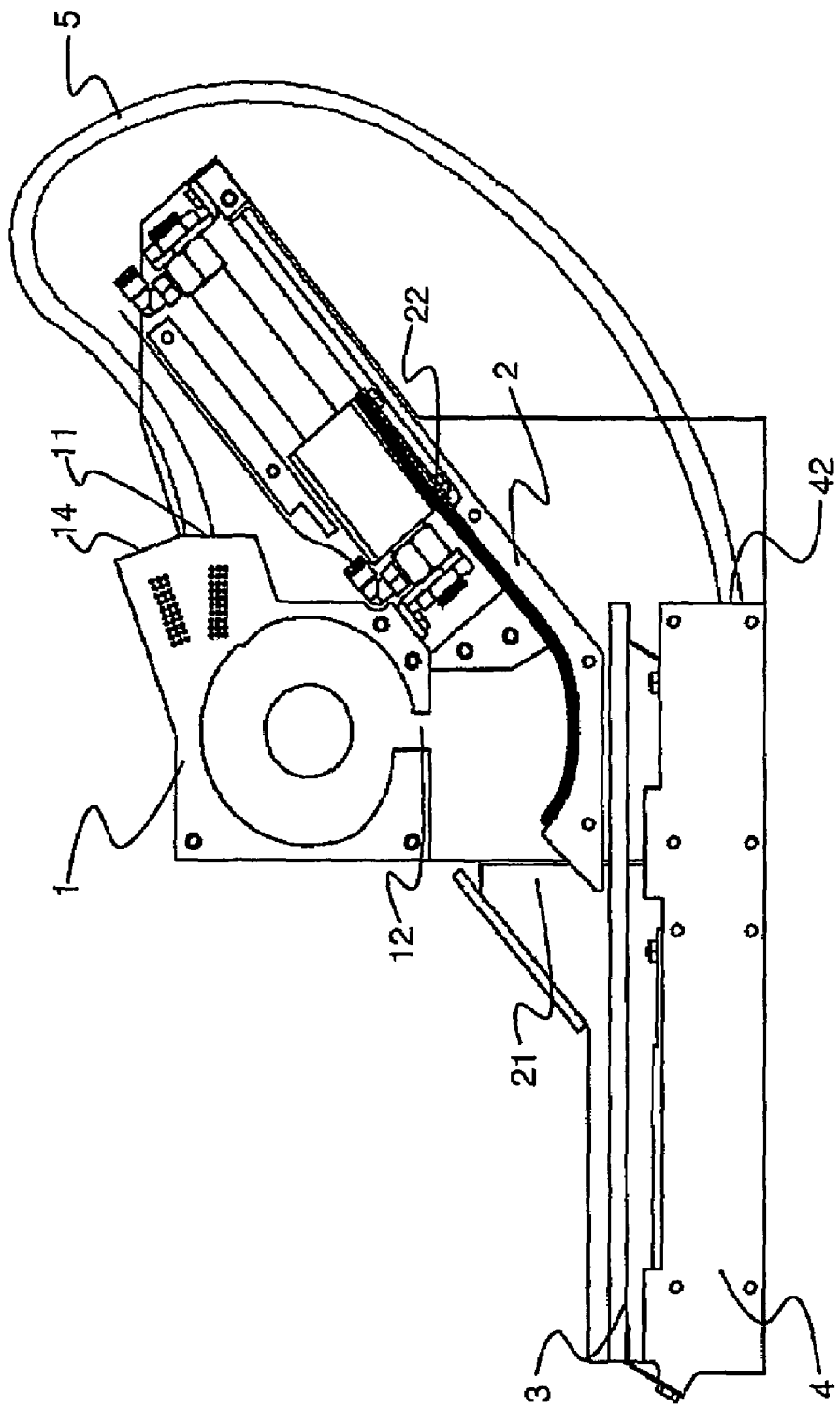

This application claims priority under 35 USC §119 to Finnish Patent Application No. 20030668 filed on May 5, 2003 and is the national phase application of PCT/FI2004/050056 under 35 U.S.C § 371.

FIELD OF THE INVENTION

The invention relates to a feeding device for feeding small parts to be identified and picked up, which said feeding device comprises at least a picking platform, a dispenser arranged to feed the parts on the picking platform, and a return member that is arranged to return unpicked parts to the dispenser. Furthermore, the invention relates to a part handling apparatus for handling small parts, which part handling apparatus comprises at least a picking device for picking a part, a machine version means for identifying the location and position of the part, and at least one feeding device for feeding the parts to the picking device, said feeding device comprising at least a picking platform, a dispenser and a return member. The invention also relates to a sorting apparatus for sorting small parts, which sorting apparatus comprises at least a picking device for picking a part, a sensor for identifying a property of the part, and at least one feeding device for feeding the parts to the picking device, said feeding device comprising at least a picking platform, a dispenser and a return member that is arranged to return the unpicked parts to the dispenser.

BACKROUND OF THE INVENTION

In automatic assembly lines different kinds of assembly devices such as robots form independently devices or other larger entities from separate parts. To be able to use the parts efficiently in a fast automatic assembly, the parts must be fed to the assembly device in a controlled manner, i.e. typically in a predetermined position. The parts can be positioned in different kinds of packages and cartridges, which can be used in the assembly. If the parts are such products which for some reason are not available in such a delivery form that they could be utilized directly in the assembly, the parts must be arranged in the desired position and order. Assembly lines are often typically provided with some kind of part feeding devices that arrange the parts in such an order that the automatic assembly device can utilize them.

Typically different kinds of bowl feeders have been used for feeding various compact parts systematically forward. The basic idea of a typical bowl feeder is that the bowl-like part of the feeder contains the parts to be handled and by vibrating the bowl the position of the parts can be changed in such a manner that some of the parts are eventually positioned in the correct position within the picking area, for example in an opening or a slot. Vibrating feeders are suitable for parts whose shape and centre of gravity bring them in the desired position under the effect of vibration. As for other kinds of parts, mechanical "filters" built in the bowl feeder may cause blockages and/or problems in the flow of materials. Furthermore, the vibrating feeder is not suitable to be used for the handling of such parts that cannot be positioned correctly or parts that cling to each other (such parts include for example coil springs).

Attempts have been made to eliminate the problems occurring in vibrating feeders by means of various feeding device solutions. Patent publication U.S. Pat. No. 5,687,831 discloses a part feeding device in which the parts are fed by means of at least two separate conveyor belts to a part picking area. The parts that are in a suitable position within the picking area are picked up by means of image recognition and transferred to further processing, typically to the assembly. The articles that are not picked up move to a kind of a collecting bucket that is guided via a separate transfer path to a first conveyor belt, in which its contents are emptied on the conveyor, which conveyor transfers the articles to the next conveyor belt and further back to the picking area. Because of the circulation, it is likely that the position of the articles changes and the articles can possibly be picked up. Said device comprises several belt conveyors and a transfer path for the collecting bucket, and therefore the device is relatively complex and prone to malfunctions. Several control parameters relate to the acceleration and deceleration ramps of the device, and thus it is laborous to adjust the device and the different control parameters. Furthermore, said different conveyor structures require a great deal of space. The device is also designed to function especially with the subsystems of the manufacturer itself. It is difficult to apply subsystems of other manufacturers, such as robots and machine vision systems in the feeding device.

SUMMARY OF THE INVENTION

The main purpose of the present invention is to disclose a part feeding device having a small size and simple structure that can be easily adapted for different kinds of parts and subsystems of different manufacturers.

To attain this purpose the part feeding device according to the invention is primarily characterized in that the feeding device also comprises a decelerator connected to the dispenser to reduce the speed of the part to be fed to the dispenser. The part handling device according to the invention is primarily characterized in that the feeding device also comprises a decelerator connected to the dispenser to reduce the speed of the part to be fed to the dispenser. The sorting device according to the invention, in turn, is primarily characterized in that the feeding device also comprises a decelerator connected to the dispenser to reduce the speed of the part to be fed to the dispenser.

The part feeding device according to the invention is intended for handling of small parts. Advantageously the size of the parts to be handled is 0.3 to 10 mm, and their weight 0.2 to 8 g, preferably the size of the parts is 0.7 to 4 mm, and their weight 0.5 to 4 g. The parts to be handled can be of various types, for example electronic components or mechanical components that can be made of various materials, such as metal or plastic.

The part feeding device is intended for feeding parts to the picking device, which comprises at least a machine vision means for identifying parts and a picking member, such as a gripper. The part feeding device comprises at least a picking platform, a dispenser, a decelerator and a return member. The picking platform is provided with a picking area in which the parts are identified and picked up. The dispenser is arranged to feed the parts to said picking platform. The return member, in turn, is arranged to return the unpicked parts via the decelerator to the dispenser.

In the part feeding device according to the invention the picking platform is a vibrating plate that is arranged to vibrate to move the parts, and to refrain from vibrating for the duration of the process of picking up the parts. The vibrating plate is also arranged to remain in a substantially constant location in relation to the dispenser and the return member in such a manner that the vibrating plate can, however, vibrate for example within the limits permitted by a spring suspension structure. The picking area of the vibrating plate is advantageously arranged to be illuminated to facilitate the identifying of parts. For this reason it is advantageous to form at least the surface of the vibrating plate positioned against the parts of a translucent plastic plate or glass plate. Furthermore, it is advantageous to form guiding structures on the surface of the vibrating plate, for example grooves or profile plates that facilitate the positioning of the parts in the desired position.

The return member that is arranged to transfer the unpicked parts by means of an air flow back to the vibrating plate via the decelerator and the dispenser is an ejector functioning by means of pressurized air. The ejector comprises an inlet for transferring the unpicked parts from the vibrating plate to the ejector and an outlet for transferring the parts from the ejector to the decelerator. Furthermore, the ejector contains the necessary connections for the supply of pressurized air.

The purpose of the decelerator is to reduce the speed of the part coming from the ejector so that it is possible to handle the part by means of the dispenser. The decelerator can be implemented in a variety of ways. The decelerator comprises at least an inlet for moving the parts from the ejector to the decelerator and an outlet for moving the parts to the dispenser. Furthermore, a preferred embodiment of the decelerator comprises a second inlet from which new parts are fed in the decelerator advantageously by means of a rapid pressurized air pulse. The dispenser connected to the outlet of the decelerator contains suitable means for transferring the parts to the vibrating plate in such a manner that the parts are positioned on the vibrating plate as evenly as possible.

The basic idea of the invention is to feed the parts in the part feeding device from the dispenser to the vibrating plate, and to change the position and location of the parts on the vibrating plate by means of vibration and the design of the vibrating plate. On the vibrating plate the parts in the suitable position are identified and picked up by a sense system, for example by means of machine vision, or in some embodiments manually, and said parts are transferred to further processing. The parts that cannot be picked up are guided back to the dispenser that dispenses the parts coming to the vibrating plate in such a manner that the desired amount of parts to be picked up is located on the picking area of the vibrating plate. The transfer of the parts after the vibrating plate back to the dispenser is performed by means of an ejector functioning by means of pressurized air. In some embodiments of the invention it is also possible to use the ejector for small-scale storing of parts, but preferably the parts are transferred from the ejector to the decelerator as rapidly as possible, wherein the possibility of blockages in the return channel is reduced. In a preferred embodiment the dispenser functions as a storage for the parts, from which the parts are transferred into circulation.

In a preferred embodiment of the invention the parts to be fed are located in a container formed by the dispense and/or the decelerator from which the flexible belt of the dispenser that is moved by means of a pneumatic cylinder drops the parts on the vibrating plate. The vibrating plate contains an electric motor that produces vibration by means of counterweight. The parts travel along the vibrating plate, from which the machine vision system detects the parts, stops the vibration and informs the coordinates and orientations of the parts to a robot or another part handling system. The parts that are not picked up continue their travel until they fall from the vibrating plate, and they are blown by means of pressurized air along the ejector and the pipe back to the decelerator, from which they travel back to the dispenser. In a preferred embodiment the vibrating plate is tilted and provided with a backlight.

A part feeding device according to the present invention is capable of feeding 60 to 100 parts per minute to the part handling system. Typically the device contains 100 to 300 parts, and 30 to 60 of them are positioned at a time on the vibrating plate to be picked up. However, the size and other characteristics of the parts affect the handling speed and the number of parts.

The invention is well suited for flexible feeding of very small parts within a constrained space because one embodiment of the part feeding device according to the invention requires only a small amount of space. Furthermore, it is possible to make a preferred embodiment of the part feeding device suitable for handling of various parts only by changing the control data.

In a preferred embodiment of the invention the flexibility is increased by the modular configuration. The primary modules—the ejector, the vibrating plate and the dispenser—can be replaced quite rapidly. Typically the only module that has to be replaced when the parts are changed is the vibrating plate, which can be replaced easily in the preferred embodiment.

It is possible to form different kinds of apparatuses and systems of the part feeding devices according to the invention. One advantageous embodiment is to form a part handling apparatus from several part feeding devices placed next to each other, in which part handling apparatus different parts are fed by means of different part feeding devices. Suitable subassemblies and/or products are assembled of the different parts by means of the picking device of the part handling apparatus. Thus, only one part identifying member and picking device is necessary in the apparatus, by means of which it is possible to control all adjacent picking areas of the part feeding devices.

Another embodiment is to form a kind of a sorting apparatus by connecting the picking devices in series. Thus, the unpicked parts are guided from the ejector of the first picking apparatus to the second picking device, and from the ejector of the second picking device the unpicked parts are guided to the next picking device, etc. In each picking apparatus the parts fulfilling the criteria determined for said picking device are picked up. By means of such picking apparatus it is possible to sort the parts by using several different sorting conditions.

SUMMARY OF THE INVENTION

Figure 2:
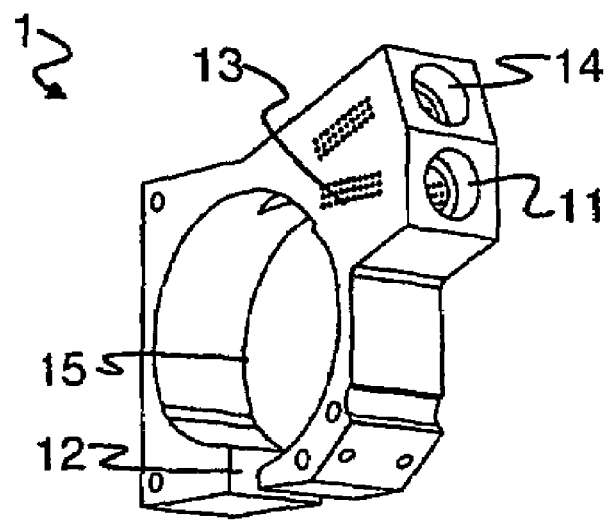
Figure 3:
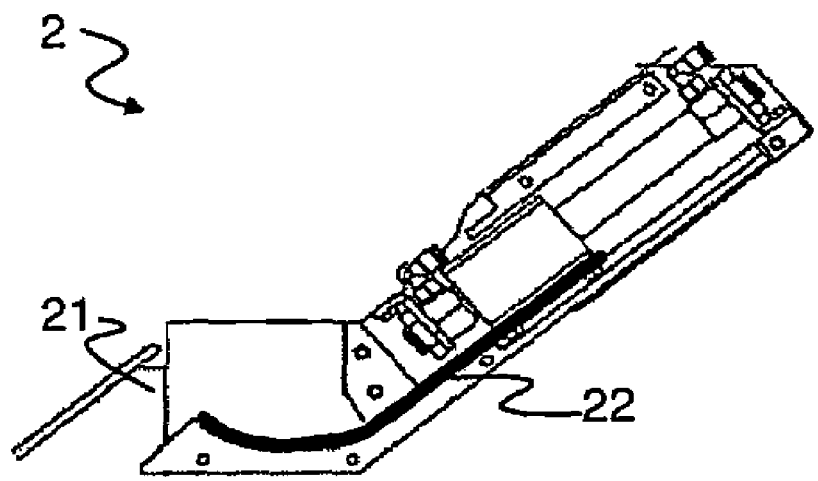
Figure 4:
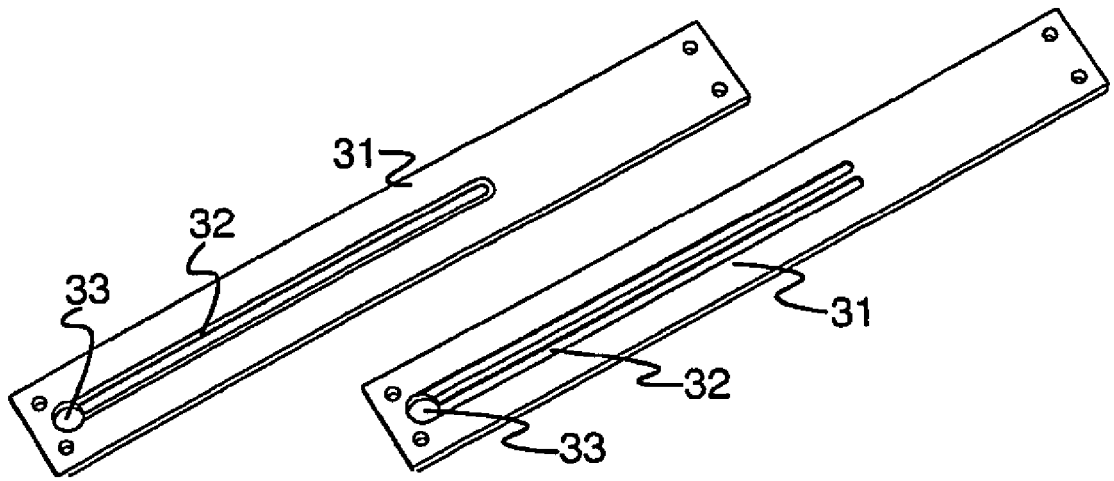
Figure 5:
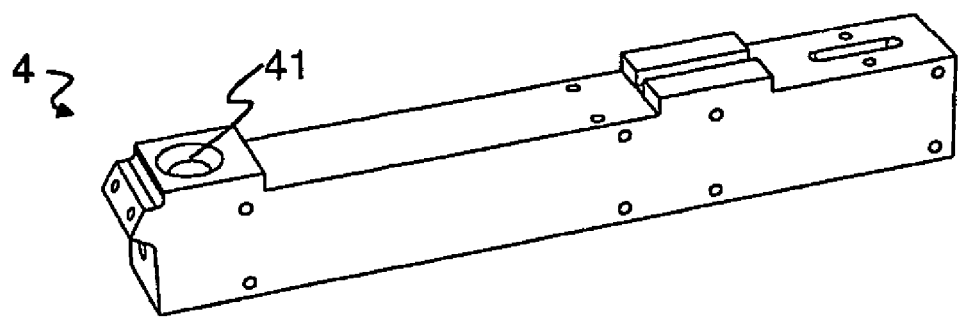
Figure 6:
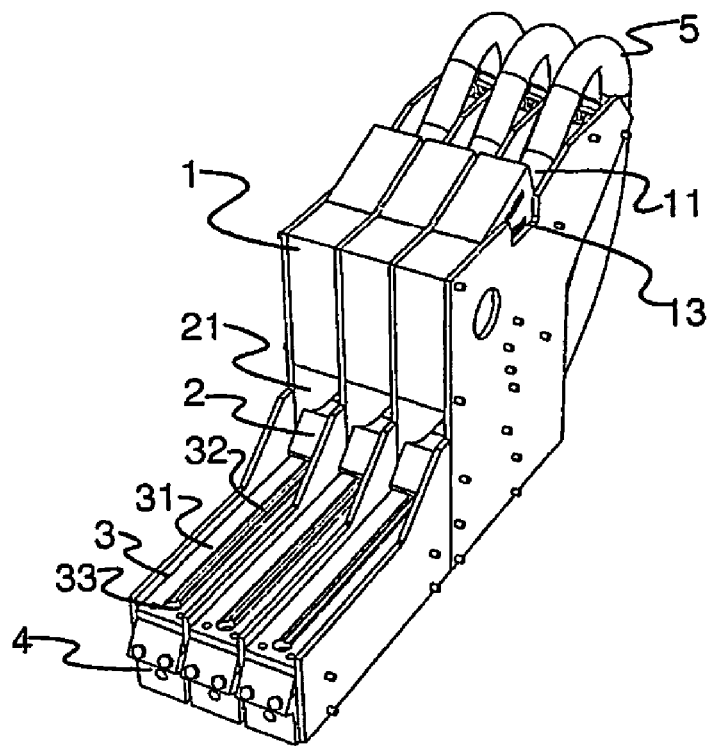
Figure 7:
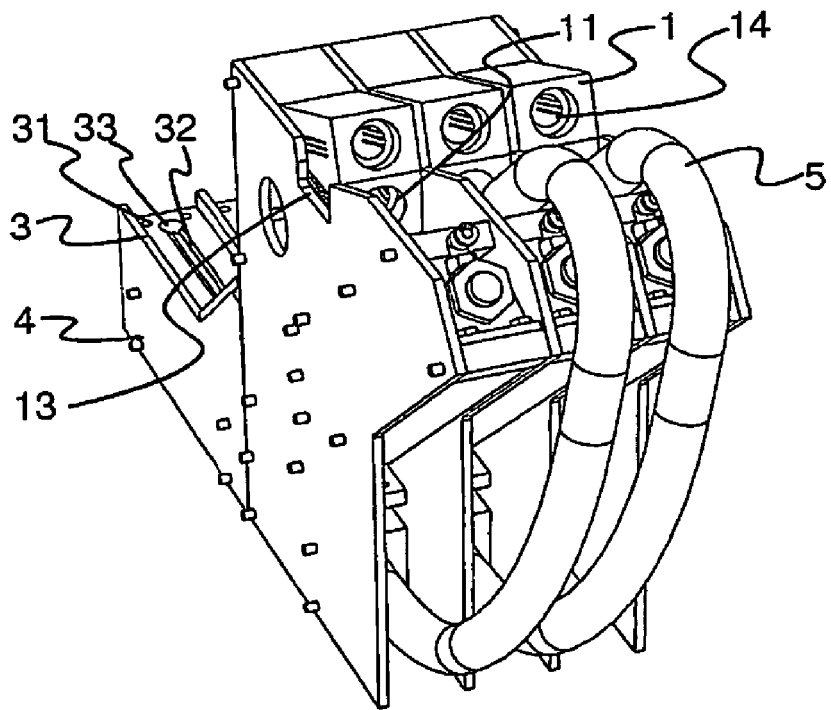

In the following, the invention will be described in more detail with reference to the appended principle drawings, in which FIG. 1 shows an embodiment of the part feeding device according to the invention, FIG. 2 shows an embodiment of the decelerator, FIG. 3 shows an embodiment of the dispenser, FIG. 4 shows an embodiment of the vibrating plate, FIG. 5 shows an embodiment of the ejector, FIG. 6 shows an assembly system, and FIG. 7 shows a sorting system.

For the sake of clarity, the figures only show the details necessary for understanding the invention. The structures and details which are not necessary for understanding the invention and which are obvious for anyone skilled in the art have been omitted from the figures in order to emphasize the characteristics of the invention.

DETAILED DESCRIPTION OF THE INVENTION

FIG. 1 shows in principle a preferred embodiment of the feeding device according to the invention, comprising a decelerator 1, a dispenser 2, a picking platform 3, i.e. a vibrating plate and a return member 4, i.e. an ejector. The figure also shows a channel 14 used for feeding new parts that is positioned in the decelerator 1.

The decelerator 1 can be implemented in various ways, for example as a cushioning wall structure, with which the part coming from the ejector collides, wherein its speed is substantially reduced. Another way is to form the decelerator 1 as a long passage in which the speed of the part is reduced. FIG. 2 shows a preferred embodiment of the decelerator 1 that takes a substantially small amount of space, gradually reducing the speed of the part. The decelerator 1 contains at least an inlet opening 11 and an outlet opening for the parts 12. Via the inlet opening 11 the parts are fed from the ejector 4 to the decelerator 1. Preferably, the decelerator 1 also contains a second inlet opening 14, via which new parts are fed to the part feeding device. The decelerator 1 can be designed in various ways, but it is advantageous to form the chamber 15 of the decelerator in the way disclosed in the figure. Thus, the round shape of the chamber 15 enables the rotating movement of the part coming from the inlet opening 11, 14 at high speed. Thus, the part does not suddenly hit the walls, and thus it is unlikely that the part will be damaged. The kinetic energy of the part is used for the rotating movement, and when the energy runs out, the part falls from the outlet opening 12 on the dispenser 2. The figure also shows air discharge openings 13 on the walls of the decelerator, via which the overpressure produced by the ejector 4 is discharged in a controlled manner. Via the outlet opening 12 of the decelerator 1 the parts are fed from the filling opening of the dispenser 2 to the dispenser. From the dispenser 2 the parts are fed via a feed opening to the vibrating plate 3 by means of a feeding member 22.

FIG. 3 shows a way of implementing the feeding member 22 of the dispenser 2, but it is also possible to implement the feeding member 22 in several different ways according to the spirit of the invention. Said feeding member 22 is composed of an actuator producing the movement and a pushing part which in said embodiment is formed of a rigid plastic belt by means of which an advantageous structure of the pushing part is attained that follows the inner surfaces of the dispenser 2 closely. Thus, the presented feeding member 22 is a kind of a pusher that pushes parts in front of itself towards the feed opening 21. Preferably the feeding member 22 pushes only the lowermost parts in a pile to the feed opening 21. When the feeding member 22 has reached its extreme position, i.e. it has advantageously pushed all the parts in front of it to the feed opening 21, the feeding member returns to the original position. Thus, the parts 22 accumulated on top of the feeding member 22 move in front of the feeding member. In this embodiment, the substantially linear movement of the feeding member is attained by means of a pneumatic cylinder whose speed of motion can be adjusted.

The shape and materials of the decelerator 1 and the dispenser 2 and the different parts thereof may vary from that presented hereinabove. For example the feeding member 22 can be designed as a "lever" functioning in a sweeper-like manner, or the pushing part can be designed as a pushing plate. The materials, in turn, can be various plastics or metals. Instead of a pneumatic cylinder it is also possible to use as an actuator for example such electrical or hydraulic actuators by means of which the desired operating speeds and forces are attained.

The picking platform 3, i.e. vibrating plate of the part feeding device according to the invention comprises at least a platform 31 and a vibrating member. Some embodiments of the platform 31 of the vibrating plate 3 are shown in FIG. 4.

The platform 31 is a hard, preferably translucent plate, such as a plate made of a plastic sheet or glass. The material is preferably translucent, because then it is possible to arrange the illumination of the vibrating plate, which has an advantageous effect on image recognition. The surface of the platform 31 is advantageously provided with guiding structures 32, such as grooves, which are preferably grooves extending in the longitudinal direction (from the direction of the dispenser 2 to the ejector opening 33), by means of which grooves it is possible to facilitate the desired positioning of the parts to be handled. According to one embodiment, the guiding structures 32 can also be implemented by means of profile plates placed on top of the platform. Said profile plates are equipped with suitable guiding structures 32, such as grooves or walls.

In a preferred embodiment, the platform 31 of the vibrating plate 3 is arranged in a slightly oblique position in such a manner that the platform slants from the direction of the dispenser 2 towards the ejector opening 33, wherein the propagation of the parts takes place at a higher speed than without the slanting. In a second preferred embodiment the propagation of the parts is affected by the frequency and amplitude of the vibration, as well as by means of the design of the suspension springs of the vibrating plate 3.

The vibration of the vibrating plate 3 is produced by means of the vibrating member. As an actuator of the vibrating member it is possible to use several different members, such as actuators functioning by means of electricity, pressurized air or hydraulics (such as motors, typically). For the sake of use it is advantageous that the frequency of the vibration produced by the vibrating member can be adjusted, and in some embodiments it is also useful that the amplitude can be adjusted as well. By means of the adjustable vibrating properties it is possible to adjust the vibration of the vibrating plate 3 optimally with respect to the parts to be handled, wherein the positioning of the parts to the desired position becomes as effective as possible. One suitable vibrating member comprises an electric motor and a counterweight, wherein the vibrating frequency is affected by the adjustment of the rotating speed of the motor.

Possible illumination of the vibrating plate 3 can also be implemented in various ways, for example below the platform 31 or from the end of the platform. In a preferred embodiment the platform 31 is used as a photoconductor from the end of which light is guided inside. By means of a suitable treatment of the platform 31 (for example matt treatment) it is possible to direct the light to the part for example from the ends of the groves 32, or from below. As a light source it is possible to use different kinds of suitable solutions, but one advantageous way is to use LED components which are selected so that the wavelength of the light emitted by the components is as suitable as possible with respect to the properties of the camera used for image recognition.

The material and color of the platform 31 of the vibrating plate 3 is preferably selected in accordance with the parts handled by means of the part feeding device, as well as in accordance with the properties of the camera used for image recognition. Thus, the strength and friction properties of the platform 31, as well as its part separating capacity can be optimized.

FIG. 5 shows in more detail a preferred embodiment of the return member 4 i.e. the ejector of the part feeding device according to the invention. Said ejector structure 4 comprises an inlet opening 41 and an outlet opening for the parts. The motion of the parts coming to the ejector 4 via the inlet opening is produced by means of an air flow, because of which the ejector is provided with at least one air nozzle. The air nozzle is connected to a supply of pressurized air via a suitable control valve. The air nozzle can comprise one or several air discharge openings. Via the nozzle or nozzles a strong flow of air is conducted inside the ejector 4, the strength of said air flow being such that the air flow is capable of moving the parts to be handled back to the decelerator 1 or in some embodiments directly to the dispenser 2. Furthermore, it is advantageous to make it possible to adjust the strength and direction of the air flow.

The different functional modules of the part feeding device shown in FIGS. 2 to 5 are arranged in contact with each other so that the part feeding device shown in FIG. 1 is formed thereof. Thus, the dispenser 2 is positioned in such a manner that its feed opening 21 is located above the first end of the vibrating plate 3. The vibrating plate 3 and the ejector 4, in turn, are positioned in such a manner in the presented embodiment that the inlet opening 41 of the ejector is aligned with the ejector opening 33 at the other end of the vibrating plate. The outlet opening 42 of the ejector is connected to the inlet opening of the parts in the decelerator 1 with a suitable channel structure 5, such as a pipe. The outlet opening 12 of the decelerator 1, in turn, is connected to filling opening of the dispenser 2.

By providing the part feeding device with a modular structure in the above-presented manner, the different parts can be changed rapidly and easily. The modules of the part feeding device can thus be rapidly replaced with undamaged ones in case of possible damage, thus reducing the stoppage time. It is also especially advantageous to form the part handling apparatus, i.e. the assembly cell in such a manner that the part feeding devices therein are also modules to be attached as plug-in units. The plug-in unit of the assembly cell preferably comprises the locking, of the part feeding device and inputs for pressurized air, electricity and control data. Thus, it is possible to release the part feeding device and attach it as rapidly as possible to the assembly cell. The modularity also enables the feeding of different kinds of parts by means of the system as efficiently as possible, because for example the platform 31 of the vibrating plate 3 or the profile plate can be replaced simultaneously with the act of replacing the part to be fed by the part feeding device, unless the entire part feeding device is replaced when the part to be fed is changed.

The control of the part feeding device presented in the example is implemented by means of a program, with the help of a computer. The necessary control means with which the function of the dispenser 2, the vibrating plate 3 and the ejector 4 are controlled are connected to the computer. Furthermore, the necessary data transmission from a machine vision means and another assembly apparatus is arranged for the control system. The control system is not shown in the drawings, and it is possible to implement the control system also in another way, for example by means of programmable logic controller.

In the following, the function of the above-presented part feeding device will be described. FIG. 6 shows the part feeding part of the part feeding apparatus according to the invention, said part comprising three part feeding devices next to each other. Furthermore, a typical part feeding apparatus comprises a machine vision system or a part picking device, such as a gripper, which are not shown in the figure.

The decelerator 1 is first provided with the parts to be handled, preferably via a second inlet opening 14 discussed hereinabove. From the decelerator 1 the parts are transferred to the dispenser 2 via the outlet opening 12. The feeding member 22 of the dispenser 2 is in the initial position from which it is transferred towards the extreme position. Thus, the feeding member 22 pushes parts in front of itself, said parts falling from the feed opening 21 on the vibrating plate 3 at some point. Preferably, the feeding member 22 pushes to the feed opening 21 only the lowermost parts of the parts located on top of each other, the rest of the parts remaining in the dispenser 2.

On the vibrating plate 3 the parts move to the picking area by means of the vibration of the platform 31. The parts in the picking area are preferably identified by means of machine vision, and said identification can be facilitated by using illumination, which is preferably set in operation for the duration of imaging. If there is a desired amount of parts in the picking area whose position corresponds to the picking conditions, the operation of the dispenser 2 and the vibrating plate 3 is stopped in one embodiment. Thereafter the part picking device picks up the parts, advantageously on the basis of the location and position data of the parts obtained from the machine vision system. The parts are transferred to the desired further process by means of the part picking device. When there are no more parts in the picking area that fulfil the picking conditions, the dispenser 2 and the vibrating plate 3 are set in operation and the above-described action is repeated. At the same time the parts that do not fulfil the picking conditions move by means of the vibration of the vibrating plate 3 via an ejector opening 33 on the platform 31 to the ejector 4. Thereafter the unpicked parts 4 accumulated in the ejector 4 are arranged to the decelerator 1 by means of a pressurized air pulse. From the decelerator 1 the parts move back to the dispenser 2.

When the feeding member 22 of the dispenser 2 reaches the extreme position, i.e. when all the parts in the dispenser to be fed have been fed, the feeding member moves to the initial position. The parts in the decelarator 1 and/or on top of the feeding member 22 of the dispenser 2 fall in front of the feeding member, whereafter the feeding of the parts is repeated. In other words, the feeding member 22 pushes the lowermost parts to the feed opening 21.

If the desired number of parts has not returned to the dispenser 1, i.e. the parts are used in the assembly, filling of parts is arranged in the decelerator. Preferably the filling is implemented automatically, and in a preferred embodiment same kind of ejector structure 4 that is used for recycling of unpicked parts is used for feeding new parts to the decelerator 1. By means of said ejector structure 4 a large amount of parts is blown to the decelerator 1 at a time.

The part feeding device according to the invention is very small and requires only a small amount of space in the cross-direction, i.e. in practice a space corresponding to the width of the vibrating plate 3 of the device. Because of this property, it is possible to arrange several feeding devices next to each other in such a manner that the picking areas of the feeding devices are positioned on the same observing area of the machine vision device. Thus, it is possible to utilize several feeding devices by means of one machine vision device and part picking device, wherein a part feeding device having a vibrating plate 3 with a suitable design and vibrating frequency especially for said part can be used for each part to be handled. In an advantageous embodiment there are 1 to 8 adjacent part feeding devices and preferably there are 3 to 6 adjacent part feeding devices.

FIG. 7, in turn, shows a sorting apparatus composed of part feeding devices according to the invention. The embodiment according to the example comprises several adjacent part feeding devices. The outlet opening 42 of the ejector 4 of the first part feeding device is connected to the inlet opening 11 of the decelerator 1 of the second feeding apparatus by means of a channel 5. The outlet opening 42 of the ejector 4 of the second part feeding device is connected to the inlet opening 11 of the decelerator 1 of the third feeding apparatus by means of a channel 5. Correspondingly, the outlet opening 42 of the ejector 4 of the third and the subsequent part feeding devices is connected to the inlet opening 11 of the decelerator 1 of the thereafter following feeding device by means of a channel 5. The outlet opening 42 of the ejector 4 of the part feeding device last in order is connected to a suitable receiver or back to the decelerator 1 of the first part feeding device 1.

The parts to be handled by the sorting apparatus are fed to the apparatus via the first part feeding device, in the example from a suitable container via a channel 5 connected to the inlet opening 14 of the decelerator 1. The moving, identification and picking up of parts takes place in the above-described manner in the part picking devices, with such a difference that from the ejector 4 the part is transferred to some other location than to the decelerator 1 of said part feeding device. In each part feeding device the parts fulfilling the desired conditions are identified and picked up. The picking can be directed for example to parts fulfilling the quality conditions or parts deviating from the quality conditions. The parts that have been picked up are transferred to a suitable further processing which can be for example an assembly process, a packing process a manufacturing process to be performed again.

When several part feeding devices are used for sorting the parts, it is possible to adjust the separate part feeding devices in such a manner that they correspond to individual sorting requirements as well as possible. For example the design, color and/or illumination of the platform 31 of the picking area can be implemented as advantageously as possible. Furthermore, it is possible to use different kinds of sensors and detectors for the process of identifying the parts, by means of which the parts can be sorted out on the basis of their shape, color, quality of the surface and/or magnetic properties. The number of part feeding devices used in the sorting apparatus depends on the number of different variables used for sorting as well as on the properties and the number of the sensors and/or detectors used for sorting. Typically, the sorting apparatus comprises 1 to 20 part feeding devices, but the number of part feeding devices can vary from one to several units, without any limitations set by the present invention.

By combining, in various ways, the modes and structures disclosed in connection with the different embodiments of the invention presented above, it is possible to produce various embodiments of the invention in accordance with the spirit of the invention. Therefore, the above-presented examples must not be interpreted as restrictive to the invention, but the embodiments of the invention can be freely varied within the scope of the inventive features presented in the claims hereinbelow.

The invention claimed is:

1. A feeding device for feeding small parts to be identified and picked up, said feeding device comprising:
a picking platform;
a dispenser arranged to feed the parts to the picking platform;
a return member, arranged to return unpicked parts from the picking platform to the dispenser, the return member comprising an air flow to move the unpicked parts; and
a decelerator connected to the dispenser to reduce a speed of the parts to be fed to the dispenser.

2. The feeding device according to claim 1, wherein the picking platform comprises an identification area and a picking area.

3. The feeding device according to claim 2, wherein at least the surface of the picking platform positioned against the parts comprises a translucent plastic sheet or glass sheet, and at least the picking area of the picking platform is arranged to be illuminated.

4. The feeding device according to claim 1, wherein at least the surface of the picking platform positioned against the parts comprises a translucent plastic sheet or glass sheet, and at least the picking area of the picking platform is arranged to be illuminated.

5. The feeding device according to claim 1, wherein the surface of the picking platform positioned against the parts is equipped with guides.

6. The feeding device according to claim 2, wherein the surface of the picking platform positioned against the parts is equipped with guides.

7. The feeding device according to claim 4, wherein the surface of the picking platform positioned against the parts is equipped with guides.

8. The feeding device according to claim 1, wherein the picking platform comprises a vibrating plate that is arranged to change a position and a location of parts arranged on the picking platform by vibration.

9. The feeding device according to claim 8, wherein a largest dimension of the parts is 0.3 to 10 mm, and the greatest weight of the parts is 0.2 to 8.0 g.

10. The feeding device according to claim 1, wherein the largest dimension of the parts is 0.3 to 10 mm, and the greatest weight of the parts is 0.2 to 8.0 g.

11. A part handling apparatus for handling small parts, said apparatus comprising:
a picking device for picking up a part;
a machine vision means for identifying the location and position of a part;
at least one feeding device for feeding parts to the picking device, said feeding device comprising
a picking platform,
a dispenser arranged to feed the parts to the picking platform,
a return member arranged to return unpicked parts from the picking platform to the dispenser, the return member comprising an air flow to move the unpicked parts, and
a decelerator connected to the dispenser to reduce a speed of the parts to be fed to the dispenser.

12. The part handling apparatus according to claim 11, wherein the picking platform comprises a vibrating plate comprising an identification area and a picking area, wherein the surface of the picking platform positioned against the parts is equipped with guides, wherein the surface of the picking platform positioned against the parts is made of a translucent plastic sheet or glass sheet, and wherein at least the picking area of the picking platform is arranged to be illuminated.

13. The part handling apparatus according to claim 11, wherein the part handling apparatus comprises 3 to 6 feeding devices.

14. The part handling apparatus according to claim 12, wherein the part handling apparatus comprises 3 to 6 feeding devices.

15. The part handling apparatus according to claim 11, further comprising:
a pressurized air operated filling system for feeding parts to the feeding device.

16. The part handling apparatus according to claim 14, further comprising:
a pressurized air operated filling system for feeding parts to the feeding device.

17. A sorting apparatus for sorting small parts, said apparatus comprising:
  a picking device for picking up a part;
  a sensor for identifying a location and a position of a part;
  at least one feeding device for feeding parts to the picking device, said feeding device comprising
    a picking platform,
    a dispenser arranged to feed the parts to the picking platform,
    a return member arranged to return unpicked parts to the dispenser, the return member comprising an air flow to move the unpicked parts, and
    a decelerator connected to the dispenser to reduce a speed of the parts to be fed to the dispenser.

18. A sorting apparatus for sorting small parts, said apparatus comprising:
  a picking device for picking up a part;
  a sensor for identifying a location and a position of a part;
  at least a first and a second feeding device for feeding parts to the picking device, said feeding devices comprising
    a picking platform,
    a dispenser arranged to feed the parts to the picking platform,
    a return member arranged to return the unpicked parts to a dispenser, the return member comprising an air flow to move the unpicked parts, and
    a decelerator connected to a dispenser to reduce a speed of the parts to be fed to the dispenser, and
  wherein the return member of the first feeding device is connected to the decelerator of the second feeding device to move unpicked parts to the second feeding device.

* * * * *